(12) United States Patent
Hu

(10) Patent No.: US 10,373,918 B2
(45) Date of Patent: *Aug. 6, 2019

(54) PACKAGE SUBSTRATE

(71) Applicant: Dyi-Chung Hu, Zhudong Township, Hsinchu County (TW)

(72) Inventor: Dyi-Chung Hu, Zhudong Township, Hsinchu County (TW)

(*) Notice: Subject to any disclaimer, the term of this patent is extended or adjusted under 35 U.S.C. 154(b) by 0 days.

This patent is subject to a terminal disclaimer.

(21) Appl. No.: 15/440,461

(22) Filed: Feb. 23, 2017

(65) Prior Publication Data

US 2017/0162523 A1    Jun. 8, 2017

Related U.S. Application Data

(63) Continuation of application No. 14/341,197, filed on Jul. 25, 2014, now Pat. No. 9,627,285.

(51) Int. Cl.
*H01L 23/00* (2006.01)
*H01L 23/498* (2006.01)
(Continued)

(52) U.S. Cl.
CPC ............ *H01L 23/562* (2013.01); *H01L 23/12* (2013.01); *H01L 23/49822* (2013.01); *H01L 23/49833* (2013.01); *H01L 23/49838* (2013.01); *H01L 23/49894* (2013.01); *H01L 24/16* (2013.01); *H01L 23/13* (2013.01); *H01L 2224/16225* (2013.01); *H01L 2224/16227* (2013.01); *H01L 2224/32225* (2013.01); *H01L 2224/73204* (2013.01); *H01L 2924/15151* (2013.01);
(Continued)

(58) Field of Classification Search
CPC ............ H01L 23/562; H01L 23/49822; H01L 23/49838; H01L 23/49894; H01L 24/16; H01L 2224/16227; H01L 2924/3512
See application file for complete search history.

(56) References Cited

U.S. PATENT DOCUMENTS 5,936,843 A    8/1999    Ohshima et al.
6,397,459 B2   6/2002    Ohshima et al.
(Continued)

FOREIGN PATENT DOCUMENTS

EP    2555240 A1    2/2013
EP    2669935 A2    12/2013
(Continued)

OTHER PUBLICATIONS

European Search Report dated Dec. 9, 2015 in European Application No. 15 17 4307.

*Primary Examiner* — Mary A Wilczewski
(74) *Attorney, Agent, or Firm* — JCIPRNET

(57) ABSTRACT

A package substrate is disclosed. The package substrate includes a molding layer, a redistribution structure, and a build-up structure. The redistribution structure is embedded in the molding layer with a surface exposed by the molding layer. The build-up structure is formed on the bottom surface of the molding layer. An inner stress caused by a CTE difference between different materials in the package substrate is reduced by forming at least one groove which is arranged around the periphery of the redistribution structure onto the top surface of the molding layer, thereby improving the problem of the redistribution structure cracking in the prior art.

18 Claims, 6 Drawing Sheets

(51) Int. Cl.
*H01L 23/12* (2006.01)
*H01L 23/13* (2006.01)

(52) U.S. Cl.
CPC ............ *H01L 2924/15174* (2013.01); *H01L 2924/15311* (2013.01); *H01L 2924/3512* (2013.01)

(56) References Cited

U.S. PATENT DOCUMENTS

| | | | |
|---|---|---|---|
| 7,928,001 B2 | 4/2011 | Kurita et al. | |
| 8,269,337 B2 | 9/2012 | Hu et al. | |
| 8,288,209 B1 | 10/2012 | Chi et al. | |
| 8,378,476 B2 | 2/2013 | Lee et al. | |
| 8,384,203 B2 | 2/2013 | Toh et al. | |
| 9,048,233 B2 | 6/2015 | Wu et al. | |
| 9,237,647 B2 | 1/2016 | Yew et al. | |
| 9,318,404 B2 | 4/2016 | Lin et al. | |
| 9,324,626 B2 | 4/2016 | Shen et al. | |
| 9,418,952 B2 | 8/2016 | Chen et al. | |
| 9,627,285 B2 * | 4/2017 | Hu | H01L 23/12 |
| 2001/0039724 A1 | 11/2001 | Ohshima et al. | |
| 2004/0007770 A1 | 1/2004 | Kurihara | |
| 2008/0079164 A1 | 4/2008 | Kurita et al. | |
| 2012/0032314 A1 | 2/2012 | Chen et al. | |
| 2012/0139120 A1 | 6/2012 | Chow et al. | |
| 2012/0146209 A1 | 6/2012 | Hu et al. | |
| 2012/0273957 A1 | 11/2012 | Meyer | |
| 2013/0032390 A1 | 2/2013 | Hu et al. | |
| 2013/0056862 A1 | 3/2013 | Kim et al. | |
| 2013/0105213 A1 | 5/2013 | Hu et al. | |
| 2013/0147054 A1 | 6/2013 | Lin et al. | |
| 2014/0027925 A1 | 1/2014 | Tseng et al. | |
| 2014/0084413 A1 | 3/2014 | Chen et al. | |
| 2014/0124822 A1 | 5/2014 | Yan | |
| 2014/0182906 A1 | 7/2014 | Hu | |
| 2014/0217597 A1 | 8/2014 | Lin et al. | |
| 2014/0264813 A1 | 9/2014 | Lin et al. | |
| 2015/0070865 A1 | 3/2015 | Yew et al. | |
| 2015/0084206 A1 | 3/2015 | Lin | |
| 2015/0155248 A1 | 6/2015 | Lin et al. | |
| 2015/0243613 A1 | 8/2015 | Chen et al. | |
| 2016/0118369 A1 | 4/2016 | Yew et al. | |
| 2017/0162523 A1 * | 6/2017 | Hu | H01L 23/12 |

FOREIGN PATENT DOCUMENTS

| | | |
|---|---|---|
| JP | H1140901 | 2/1999 |
| JP | 2005235997 | 9/2005 |
| JP | 2010034403 | 2/2010 |
| JP | 2012085045 | 4/2012 |

\* cited by examiner

PACKAGE SUBSTRATE

RELATED APPLICATION

This application is a continuation application of U.S. application Ser. No. 14/341,197, filed Jul. 25, 2014, the disclosure of which is incorporated by reference herein in its entirety.

BACKGROUND OF THE INVENTION

1. Field of the Invention

The present invention generally relates to a package substrate, and more specifically to a package substrate for a high density package.

2. Description of the Prior Art

Miniaturization of electronic products is an inevitable trend in this modern world. Accordingly, semiconductor chips and package substrates for the chips have changed in their dimensions for meeting the requirements of low-profile, compact electronic products. Nowadays, the circuit density of the semiconductor chip has become higher and higher as well as the pin count thereof, and pitches between conductive pads of the semiconductor chip have been reduced to nanoscale. However, pitches between pads of a traditional flip-chip package substrate are only at around a hundred micron. Accordingly, the traditional flip-chip package substrate may not be applicable to a semiconductor chip with a high circuit density and a high pin count. Furthermore, in a thermal cycling reliability testing procedure, there exists a large coefficient of thermal expansion (CTE) difference between the semiconductor chip and the traditional flip-chip package substrate. This causes an uneven thermal stress and may destroy the connection between the package substrate and the chip, thereby decreasing the reliability and product yield.

U.S. Pat. No. 8,269,337 discloses a package substrate. FIG. 1 depicts a cross-sectional view showing an application of the package substrate. The package substrate includes an interposer 212, a redistribution-layer structure 213, a build-up structure 24, a molding layer 22, and a semiconductor chip 27. A redistribution structure 21 is consisted of the interposer 212 and the redistribution-layer structure 213. The interposer 212 is made of glass, silicon, ceramic, or polymer. As shown in FIG. 1, the interposer 212 has a plurality of through-silicon vias (TSVs) 210 penetrating the bottom surface thereof. The redistribution-layer structure 213 is formed on the top surface of the interposer 212. The innermost circuit of the redistribution-layer structure 213 is electrically connected to the top ends of the TSVs 210, and the outer most circuit of the redistribution-layer structure 213 has a plurality of electrode pads 211. The redistribution structure 21 is embedded in the molding layer 22. The build-up structure 24 is formed on the bottom surface of the molding layer 22. The build-up structure 24 has a plurality of conductive vias 242, a portion of which are electrically connected to the bottom ends of the TSVs 210 of the interposer 212. The semiconductor chip 27 is a flip-chip electrically connected to the electrode pads 211 of the redistribution-layer structure 213 through solder bumps 271, and an underfill material 270 is used to fill the space between the electrode pads 211 and the semiconductor chip 27. A plurality of solder balls 26 are mounted on bonding pads 243 on the bottom side of the build-up structure 24, for being electrically connected to another electronic device such as a printed circuit board (not shown in the figure).

By deploying the redistribution structure 21, the package substrate can overcome the dimension mismatch between the semiconductor chip 27 and the printed circuit board. The semiconductor chip 27 with high-density or small-pitch conductive pads 272 can be disposed on the printed circuit board through the package substrate. Furthermore, the interposer 212 serves as a CTE buffer between the semiconductor chip 27 and the printed circuit board. Therefore, during thermal cycling reliability testing procedure, uneven thermal stress caused in the package substrate may be reduced. This makes the structure of the package substrate more reliable.

However, a great CTE difference may exist since the CTE of the interposer 212 is about 3 ppm/K and the CTE of the molding layer 22 and dielectric layers of the build-up layer 24 is about 5 to 15 ppm/K. Therefore, a great inner stress may occur in the embedded redistribution structure 21 and cause the cracking and failure of the redistribution structure 21.

Therefore, there is a need to provide a package substrate for overcoming the above-mentioned disadvantages in the prior art.

SUMMARY OF THE INVENTION

An objective of the present invention is to provide a package substrate which can improve the problem of the redistribution structure cracking in the prior art.

To achieve the above object, the present invention provides a package substrate which includes:

a molding layer having a first surface and a second surface opposite thereto;

a redistribution structure embedded in the molding layer, the redistribution structure having a first side and a second side opposite thereto, the first side of the redistribution structure having a plurality of electrode pads exposed from the first surface of the molding layer, the second side of the redistribution structure having a plurality of conductive portions; and a build-up structure formed on the second surface of the molding layer, the build-up structure having a first side and a second side opposite thereto, the build-up structure having a wiring layer formed at the first side of the build-up structure and a plurality of electrode pads formed at the second side of the build-up structure, the conductive portions at the second side of the redistribution structure and the wiring layer at the first side of the build-up structure being electrically connected to each other and being immersed in the package substrate, the electrode pads at the first side of the redistribution structure and the electrode pads at the second side of the build-up structure being exposed from surfaces of the package substrate, wherein there is at least one groove on the first surface of the molding layer, and the groove is arranged around the periphery of the redistribution structure.

In one exemplary embodiment of the present invention, the groove has a depth that is greater than a thickness of the redistribution structure.

In one exemplary embodiment of the present invention, the groove has a width between 10 μm and 200 μm.

In one exemplary embodiment of the present invention, the groove has a width between 50 μm and 100 μm.

In one exemplary embodiment of the present invention, a residual molding part can be further disposed between the redistribution structure and the groove.

In one exemplary embodiment of the present invention, the groove can be further filled with a filling material. The filling material has a modulus that is less than the moduli of the materials of the inner walls of the groove. The filling material can be an elastic material.

In one exemplary embodiment of the present invention, the filling material can be a low-modulus material such as silicone.

In one exemplary embodiment of the present invention, the residual molding part has a width between 10 μm and 200 μm.

In one exemplary embodiment of the present invention, the residual molding part has a width between 20 μm and 70 μm.

In one exemplary embodiment of the present invention, the distribution density of the electrode pads at the first side of the redistribution structure is higher than that of the electrode pads at the second side of the build-up structure.

In one exemplary embodiment of the present invention, the size and dimension of the electrode pads at the first side of the redistribution structure are smaller than that of the electrode pads at the second side of the build-up structure.

In one exemplary embodiment of the present invention, the redistribution structure contains a through-holed interposer and a redistribution-layer structure, the conductive portions are conductive through holes, the through-holed interposer has a first side and a second side opposite thereto and the conductive through holes penetrating the first side and the second side, each of the conductive through holes has a first end surface on the first side of the through-holed interposer and a second end surface on the second side of the through-holed interposer, the second side of the through-holed interposer and the second end surfaces of the conductive through holes are flush with the second surface of the molding layer, the redistribution-layer structure is disposed on the first side of the through-holed interposer and the first end surfaces of the conductive through holes and is electrically connected to the first end surfaces of the conductive through holes, and an outermost layer of the redistribution-layer structure has the electrode pads exposed from the first surface of the molding layer.

In one exemplary embodiment of the present invention, the redistribution structure is a core sheet, the core sheet includes a plurality of metal layers and a plurality of dielectric layers alternatively stacked, and the conductive portions are electrode pads.

In one exemplary embodiment of the present invention, the dielectric layers of the core sheet can be made of an organic polymer.

In one exemplary embodiment of the present invention, the core sheet is a flexible sheet.

In one exemplary embodiment of the present invention, the material of the dielectric layers of the core sheet can be an inorganic substance such as glass, silicon or ceramics.

In one exemplary embodiment of the present invention, the electrode pads at the first side of the redistribution structure are employed for connecting to at least one semiconductor chip.

In one exemplary embodiment of the present invention, the electrode pads at the second side of the build-up structure are employed for connecting to a printed circuit board.

The present invention has obvious advantages and beneficial effects over the prior art. The package substrate of the present invention according to the above technical scheme has at least the following advantages and beneficial effects. In the present invention, an inner stress caused by a CTE difference between different materials in the package substrate is reduced by forming at least one groove which is arranged around the periphery of the redistribution structure onto the first surface of the molding layer, thereby overcoming the CTE mismatch between the redistribution structure, the molding layer, and the build-up structure, thus solving the problem of the redistribution structure cracking in the prior art.

DETAILED DESCRIPTION OF THE PREFERRED EMBODIMENTS

Embodiments of the present invention are described in detail with the technical matters, structural features, achieved objects, and effects with reference to the accompanying drawings as follows.

Figure 1:
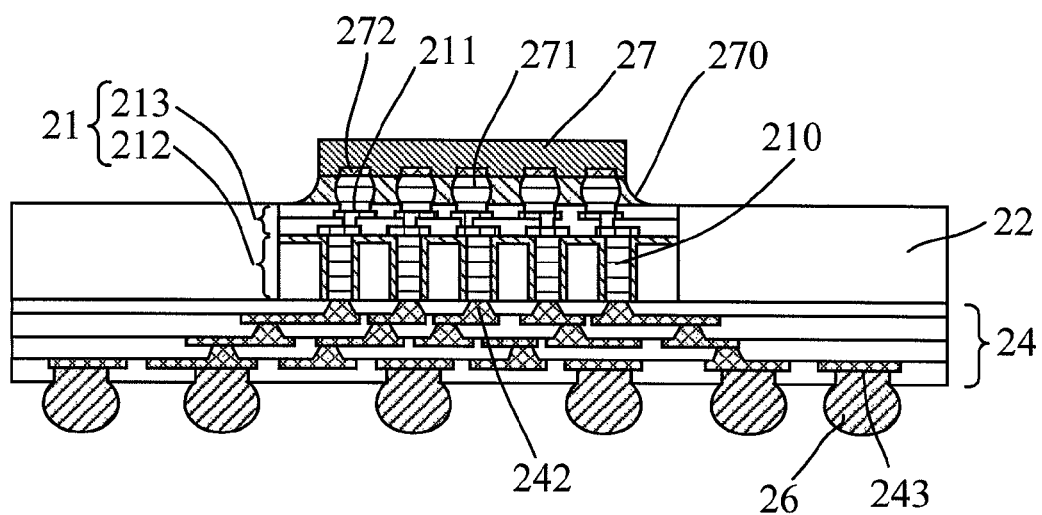
FIG. 1 is a cross-sectional view showing an application of a prior art package substrate.
Figure 2:
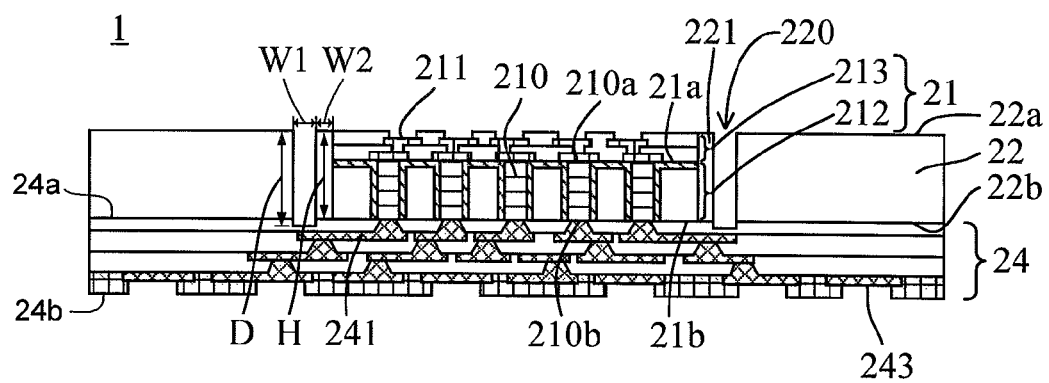
FIG. 2 is a cross-sectional view of a package substrate according to a first embodiment of the present invention.
Figure 3:
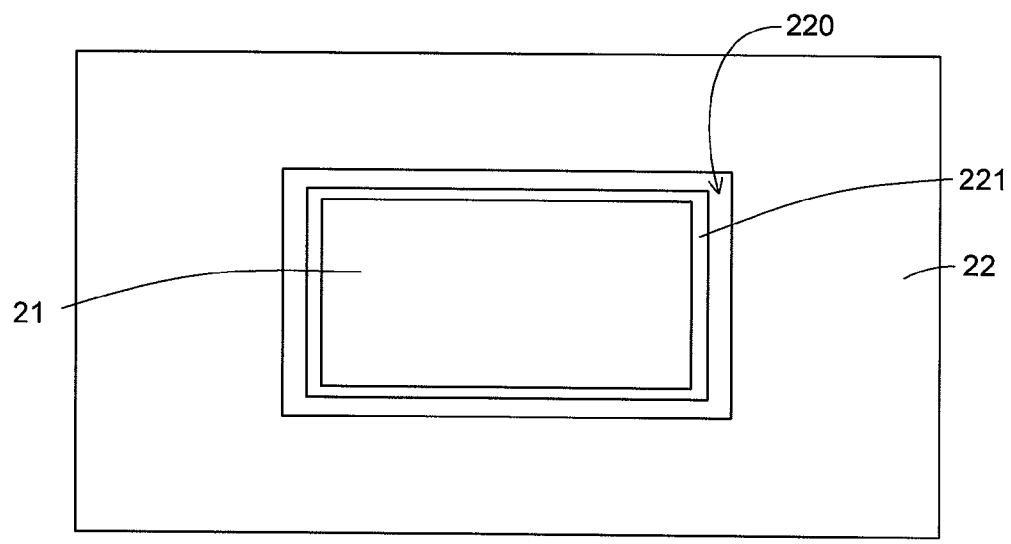
FIG. 3 is a top view of the package substrate of FIG. 2.

Please refer to FIGS. 2 and 3. FIG. 2 is a cross-sectional view of a package substrate 1 according to a first embodiment of the present invention. FIG. 3 is a top view of the package substrate of FIG. 2. The package substrate 1 includes a molding layer 22, a build-up structure 24, and a redistribution structure 21. The redistribution structure 21 contains a through-holed interposer 212 and a redistribution-layer structure 213. The molding layer 22 has a first surface 22a and a second surface 22b opposite thereto. The redistribution structure 21 is embedded in the molding layer 22 but the first surface 22a of the molding layer 22 exposes a part of the surface of the redistribution-layer structure 213. The build-up structure 24 is formed on the second surface 22b of the molding layer 22.

The through-holed interposer 212 has a first side 21a and a second side 21b opposite thereto and a plurality of conductive through holes 210 penetrating the first side 21a and the second side 21b. Each of the conductive through holes 210 has a first end surface 210a on the first side 21a of the through-holed interposer 212 and a second end surface 210b on the second side 21b of the through-holed interposer 212. The second side 21b of the through-holed interposer 212 and the second end surfaces 210b of the conductive through holes 210 are flush with the second surface 22b of the molding layer 22. The redistribution-layer structure 213 is disposed on the first side 21a of the through-holed interposer 212 and the first end surfaces 210a of the conductive through holes 210 and is electrically connected to the first end surfaces 210a of the conductive through holes 210. The outermost layer of the redistribution-layer structure 213 has a plurality of electrode pads 211 exposed from the first surface 22a of the molding layer 22. The through-holed interposer 212 is made of glass, ceramic, single crystal silicon, or polysilicon and has a thickness of 100 μm.

The build-up structure 24 has a first side 24a and a second side 24b opposite thereto. The build-up structure 24 has a wiring layer 241 formed at the first side 24a of the build-up structure 24 and a plurality of electrode pads 243 formed at the second side 24*b* of the build-up structure 24. The second end surfaces 210*b* of the conductive through holes 210 in the through-holed interposer 212 and the wiring layer 241 at the first side 24*a* of the build-up structure 24 are electrically connected to each other and are immersed in the package substrate 1. The electrode pads 211 at the outermost layer of the redistribution-layer structure 213 and the electrode pads 243 at the second side 24*b* of the build-up structure 24 are exposed from the surfaces of the package substrate 1. The distribution density of the electrode pads 211 at the outermost layer of the redistribution-layer structure 213 is higher than that of the electrode pads 243 at the second side 24*b* of the build-up structure 24. The size and dimension of the electrode pads 211 at the outermost layer of the redistribution-layer structure 213 are smaller than that of the electrode pads 243 at the second side 24*b* of the build-up structure 24. The electrode pads 211 at the outermost layer of the redistribution-layer structure 213 are employed for connecting to at least one semiconductor chip (not shown in the figure). The electrode pads 243 at the second side 24*b* of the build-up structure 24 are employed for connecting to a printed circuit board (not shown in the figure).

There is a groove 220 on the first surface 22*a* of the molding layer 22, and the groove 220 is arranged around the periphery of the redistribution structure 21. The groove 220 has a depth D that is greater than a thickness H of the redistribution structure 21. The groove 220 has a width W1 of 100 µm. The groove 220 can be formed by an ultraviolet (UV) laser. A residual molding part 221 is disposed between the redistribution structure 21 and the groove 220, and is used for protecting the redistribution structure 21. The material of the residual molding part 221 is the same as the material of the molding layer 22. The residual molding part 221 has a width W2 of 50 µm. In another embodiment of the present invention, the groove 220 can be further filled with a low-modulus material such as silicone (not shown in the figure).

Figure 4:
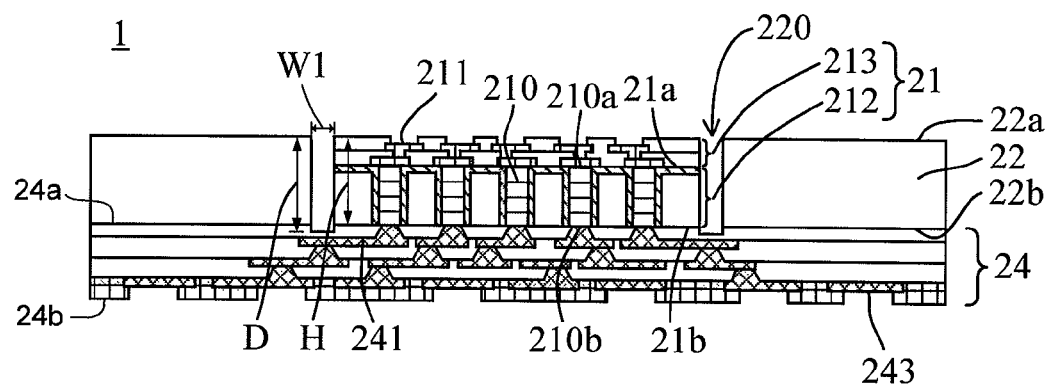
FIG. 4 is a cross-sectional view of a package substrate according to another form of FIG. 2.
Figure 5:
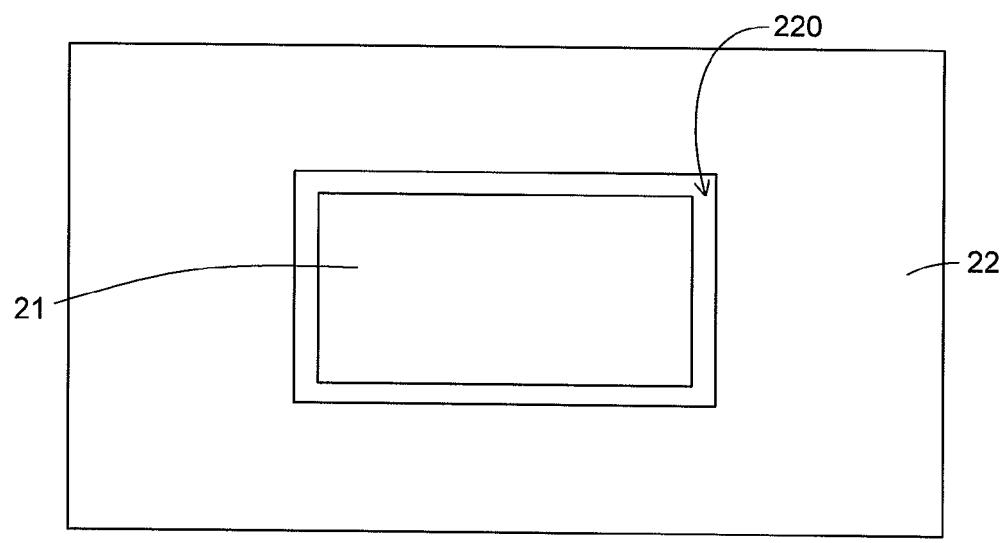
FIG. 5 is a top view of the package substrate of FIG. 4.

FIGS. 4 and 5 are another form of the package substrate 1 of FIG. 2. In which, a groove 220 is provided on a first surface 22*a* of a molding layer 22. The groove 220 is arranged around the periphery of a redistribution structure 21 which contains a through-holed interposer 212 and a redistribution-layer structure 213. The groove 220 abuts the redistribution structure 21.

Figure 6:
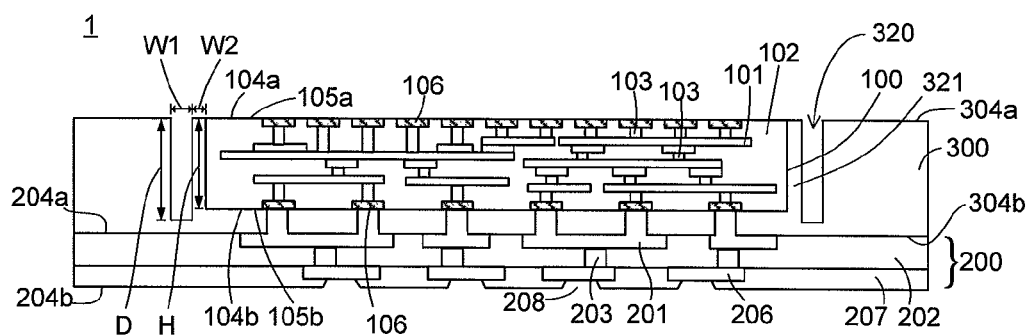
FIG. 6 is a cross-sectional view of a package substrate according to a second embodiment of the present invention.
Figure 7:
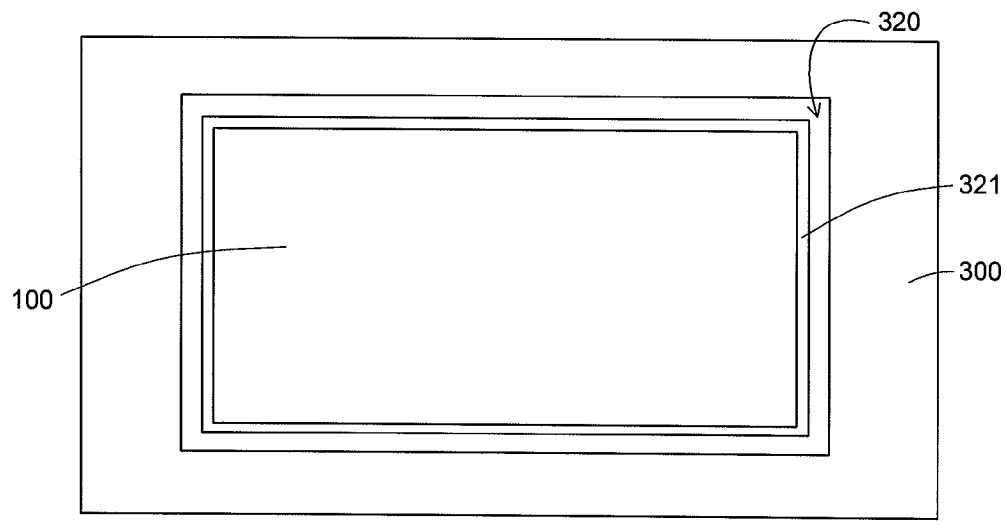
FIG. 7 is a top view of the package substrate of FIG. 6.

Please refer to FIGS. 6 and 7. FIG. 6 is a cross-sectional view of a package substrate 1 according to a second embodiment of the present invention. FIG. 7 is a top view of the package substrate of FIG. 6. The package substrate 1 includes a core sheet 100 (redistribution structure), a build-up structure 200, and a molding layer 300. The molding layer 300 has a first surface 304*a* and a second surface 304*b*. The first surface 304*a* and the second surface 304*b* are on opposite sides of the molding layer 300. The core sheet 100 is embedded in the molding layer 300 with a surface exposed by the molding layer 300. The build-up structure 200 is formed on the second surface 304*b* of the molding layer 300.

The core sheet 100 has a plurality of metal layers 101 and a plurality of dielectric layers 102 disposed therein. The metal layers 101 and the dielectric layers 102 are alternatively formed by stacking one on top of another. Any two adjacent metal layers 101 can be electrically connected by a conductive via 103 formed therebetween. It is noted that although the dielectric layers 102 of FIG. 6 and successive figures are shown by a single-layer configuration for simplicity, the core sheet 100 actually consists of many dielectric layers. Specifically, the dielectric layers 102 of the core sheet 100 can be made of an organic polymer. Polyimide can be used as an illustrative example. Also, the material of the dielectric layers 102 of the core sheet 100 can be an inorganic substance as well. The material of the dielectric layers 102 can be implemented by ceramic or glass, for example, Silicon Nitride, Silicon Oxide, and water glass. Other materials can be considered as well.

The core sheet 100 has two opposite sides, that is, a first side 104*a* and a second side 104*b*. Specifically, the core sheet 100 has a first surface 105*a* at the first side 104*a* and a second surface 105*b* at the second side 104*b*. There are a plurality of electrode pads 106 formed at the first side 104*a* and the second side 104*b* of the core sheet 100, preferably, formed beneath the first surface 105*a* and the second surface 105*b*. The electrode pads 106 of the core sheet 100 serve as electrical connecting points for electrically connecting the core sheet 100 to other electronic components. As shown in FIG. 6, the molding layer 300 exposes the first surface 105*a* of the core sheet 100, and the distribution density of the electrode pads 106 formed at the first side 104*a* of the core sheet 100 is greater than that of the electrode pads 106 formed at the second side 104*b*.

The build-up structure 200 has a first side 204*a* and a second side 204*b*. The first side 204*a* and the second side 204*b* are on opposite sides of the build-up structure 200. The build-up structure 200 has a wiring layer 201 formed at the first side 204*a*, a plurality of electrode pads 206 formed at the second side 204*b*, a plurality of conductive vias 203 disposed between the wiring layer 201 and the electrode pads 206, and at least one dielectric layer 202. The wiring layer 201 formed at the first side 204*a* and the electrode pads 206 formed at the second side 204*b* are formed in the outermost layers of the build-up structure 200. As shown in FIG. 6, the wiring layer 201 formed at the first side 204*a* of the build-up structure 200 is electrically connected to the electrode pads 106 formed at the second side 104*b* of the core sheet 100. The build-up structure 200 preferably has a protective insulating layer 207 such as a solder mask, formed on an outermost dielectric layer at the second side 204*b* of the build-up structure 200. The protective insulating layer 207 has a plurality of openings 208, through which the electrode pads 206 at the second side 204*b* are exposed, serving as electrical connecting points. It is noted that the build-up structure 200 may be employed with a multi-layer structure having a plurality of metal layers and dielectric layers, and preferably, may have interconnections therebetween.

The distribution density of the electrode pads 106 at the first side 104*a* of the core sheet 100 is higher than that of the electrode pads 206 at the second side 204*b* of the build-up structure 200. The size and dimension of the electrode pads 106 at the first side 104*a* of the core sheet 100 are smaller than that of the electrode pads 206 at the second side 204*b* of the build-up structure 200. The electrode pads 106 at the first side 104*a* of the core sheet 100 are employed for connecting to at least one semiconductor chip (not shown in the figure). The electrode pads 206 at the second side 204*b* of the build-up structure 200 are employed for connecting to a printed circuit board (not shown in the figure).

There is a groove 320 on the first surface 304*a* of the molding layer 300, and the groove 320 is arranged around the periphery of the core sheet 100. The groove 320 has a depth D that is greater than a thickness H of the core sheet 100. The groove 320 has a width W1 of 100 µm. The groove 320 can be formed by an UV laser. A residual molding part 321 is disposed between the core sheet 100 and the groove 320, is used for protecting the core sheet 100. The material of the residual molding part 321 is the same as the material of the molding layer 300. The residual molding part 321 has a width W2 of 50 µm. In another embodiment of the present invention, the groove 320 can be further filled with a low-modulus material such as silicone (not shown in the figure).

Figure 8:
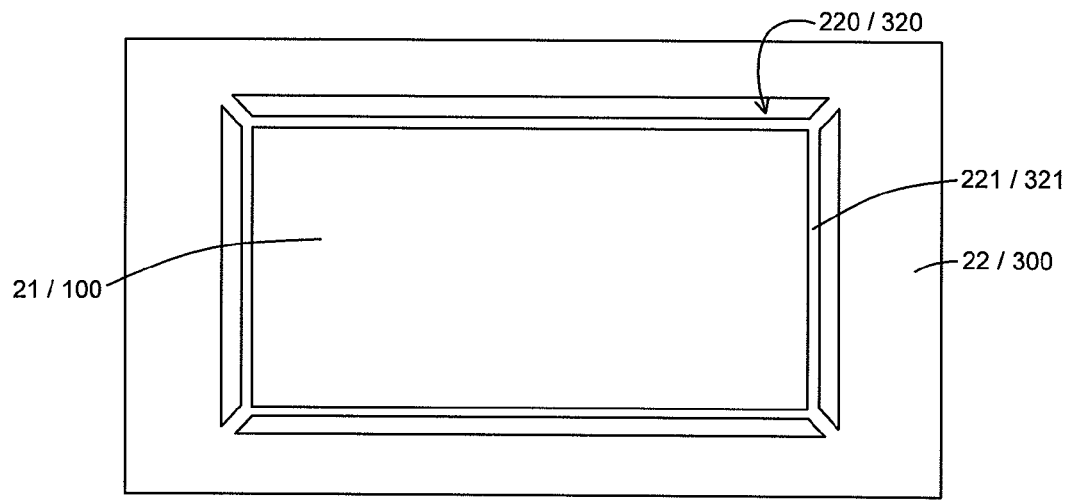
FIGS. 8 to 10 are top views of the package substrates according to other embodiments of the present invention.
Figure 9:
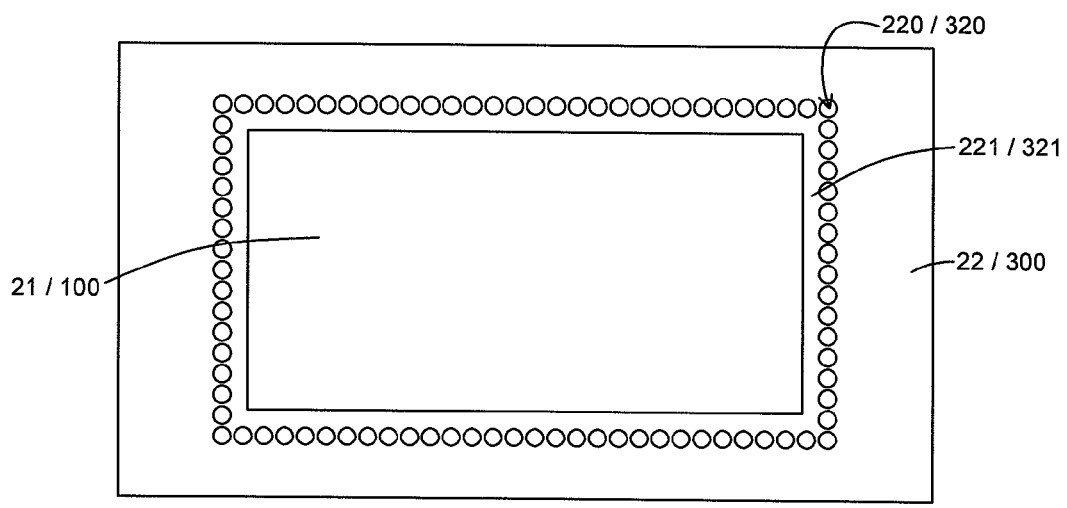
Figure 10:
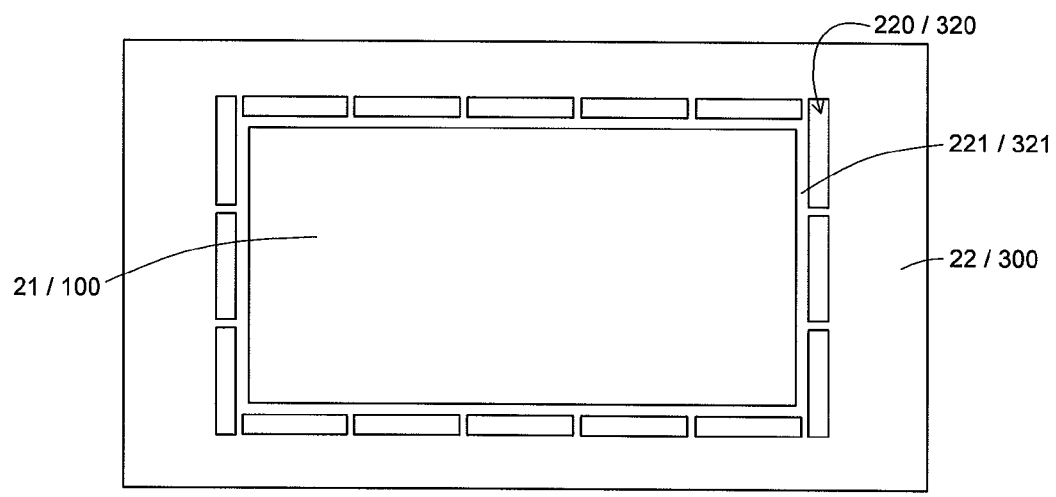

In other embodiments of the present invention, the groove 220, 320 in FIG. 3 or 7 can has various forms, e.g., refer to FIG. 8 to FIG. 10. However, the present invention is not limited thereto.

As mentioned above, in the package substrate 1 of the present invention, an inner stress caused by a CTE difference between different materials in the package substrate 1 is reduced by forming at least one groove 220, 320 which is arranged around the periphery of the redistribution structure 21, 100 onto the first surface 22a, 304a of the molding layer 22, 300, thereby overcoming the CTE mismatch between the redistribution structure 21, 100, the molding layer 22, 300, and the build-up structure 24, 200, thus solving the problem of the redistribution structure 21, 100 cracking in the prior art.

It should be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

The invention claimed is:

1. A package substrate, comprising:
a redistribution structure having a plurality of top electrode pads, the plurality of top electrode pads being configured with a first density adaptive for a chip to mount thereon;
a build-up layer configured on bottom of the redistribution structure, the build-up layer having a plurality of bottom mounting pads, the plurality of bottom mounting pads being configured with a second density adaptive for the substrate to mount onto a printed circuit board, the second density being lower than the first density;
a molding layer embedding the redistribution structure therein; a groove extending around the redistribution structure; and
a dielectric material filled in the groove,
wherein
the groove contains no conductive material,
an open end surface of the groove is at the same height as a top surface of the redistribution structure,
the top surface of the redistribution structure is a surface of the redistribution structure farthest away to the build-up layer,
a depth of the groove is greater than an entire thickness of the redistribution structure,
a first portion of the molding layer is interposed between the groove and the redistribution structure,
the material of the dielectric material filled in the groove is different from the material of the molding layer, and
a second portion of the molding layer is interposed, in a thickness direction of the package substrate, between the redistribution structure and the build-up layer.

2. A package substrate as claimed in claim 1, wherein a width of the first portion of the molding layer is smaller than a width of the groove.

3. A package substrate as claimed in claim 1, further comprising:
a chip mounted on the plurality of top electrode pads, wherein
the redistribution structure and the groove are entirely below the chip,
the build-up layer includes a topmost dielectric layer in which a topmost circuitry of the build-up layer is embedded,
the groove extends from a top surface of the molding layer, through an entire thickness of the molding layer, and into the topmost dielectric layer of the build-up layer, and
the molding layer has a bottom surface in direct contact with a top surface of the topmost dielectric layer of the build-up layer.

4. A package substrate as claimed in claim 1, wherein the dielectric material filled in the groove is silicone.

5. A package substrate as claimed in claim 1, further comprising: an interposer embedded in the redistribution structure.

6. A package substrate as claimed in claim 5, wherein the dielectric material filled in the groove is silicone.

7. A package substrate, comprising:
a redistribution structure having a plurality of top electrode pads, the plurality of top electrode pads being configured with a first density;
a build-up layer configured on bottom of the redistribution structure, the build-up layer having a plurality of bottom mounting pads, the plurality of bottom mounting pads being configured with a second density adaptive for the substrate to mount onto a printed circuit board, the second density being lower than the first density;
a molding layer embedding the redistribution structure therein; and
a groove extending around the redistribution structure, wherein
an open end surface of the groove is at the same height as a top surface of the redistribution structure,
the top surface of the redistribution structure is a surface of the redistribution structure farthest away from the build-up layer,
a depth of the groove is greater than an entire thickness of the redistribution structure,
the groove contains no conductive material, and
the groove extends from a top surface of the molding layer, through an entire thickness of the molding layer, and into a portion of the build-up layer.

8. A package substrate as claimed in claim 7, wherein a bottom of the groove is below a bottommost circuitry of the redistribution structure.

9. A package substrate as claimed in claim 7, wherein a portion of the groove above the bottom of the groove is embedded in the build-up layer with a topmost circuitry.

10. A package substrate as claimed in claim 9, wherein the build-up layer includes a topmost dielectric layer in which the topmost circuitry of the build-up layer is embedded, and
the molding layer has a bottom surface in direct contact with a top surface of the topmost dielectric layer of the build-up layer.

11. A package substrate as claimed in claim 7, further comprising:
an interposer embedded in the redistribution structure.

12. A package substrate as claimed in claim 7, wherein the build-up layer includes a topmost dielectric layer in which a topmost circuitry of the build-up layer is embedded, and the molding layer has a bottom surface in direct contact with a top surface of the topmost dielectric layer of the build-up layer.

13. A package substrate as claimed in claim 12, wherein the groove extends continuously around the redistribution structure.

14. A package substrate as claimed in claim 12, wherein the groove abuts the redistribution structure.

15. A package substrate as claimed in claim 12, wherein, in a top plan view, the groove comprises four independent section grooves arranged along four sides of the redistribution structure, respectively.

16. A package substrate as claimed in claim 12, wherein, in a top plan view, the groove comprises a plurality of holes arranged along four sides of the redistribution structure.

17. A package substrate as claimed in claim 12, wherein, in a top plan view, the groove comprises a plurality of rectangular grooves arranged along four sides of the redistribution structure.

18. A package substrate as claimed in claim 12, further comprising: an interposer embedded in the redistribution structure.

\* \* \* \* \*